(12) United States Patent
Su et al.

(10) Patent No.: US 8,802,509 B2
(45) Date of Patent: Aug. 12, 2014

(54) CONFIGURATION OF GATE TO DRAIN (GD) CLAMP AND ESD PROTECTION CIRCUIT FOR POWER DEVICE BREAKDOWN PROTECTION

(75) Inventors: Yi Su, Sunnyvale, CA (US); Anup Bhalla, Santa Clara, CA (US); Daniel Ng, Campbell, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 772 days.

(21) Appl. No.: 12/932,584

(22) Filed: Feb. 28, 2011

(65) Prior Publication Data

US 2011/0151628 A1    Jun. 23, 2011

Related U.S. Application Data

(62) Division of application No. 12/378,039, filed on Feb. 9, 2009, now Pat. No. 7,902,604.

(51) Int. Cl.
*H01L 21/822* (2006.01)

(52) U.S. Cl.
USPC .......................................... 438/128; 438/142

(58) Field of Classification Search
USPC ................................................... 438/128, 142
See application file for complete search history.

(56) References Cited

U.S. PATENT DOCUMENTS 5,536,958 A * 7/1996 Shen et al. ..................... 257/356

* cited by examiner

*Primary Examiner* — Long Pham
(74) *Attorney, Agent, or Firm* — Bo-In Lin

(57) ABSTRACT

A semiconductor power device supported on a semiconductor substrate comprising a plurality of transistor cells each having a source and a drain with a gate to control an electric current transmitted between the source and the drain. The semiconductor further includes a gate-to-drain (GD) clamp termination connected in series between the gate and the drain further includes a plurality of back-to-back polysilicon diodes connected in series to a silicon diode includes parallel doped columns in the semiconductor substrate wherein the parallel doped columns having a predefined gap. The doped columns further include a U-shaped bend column connect together the ends of parallel doped columns with a deep doped well disposed below and engulfing the U-shaped bend.

3 Claims, 9 Drawing Sheets

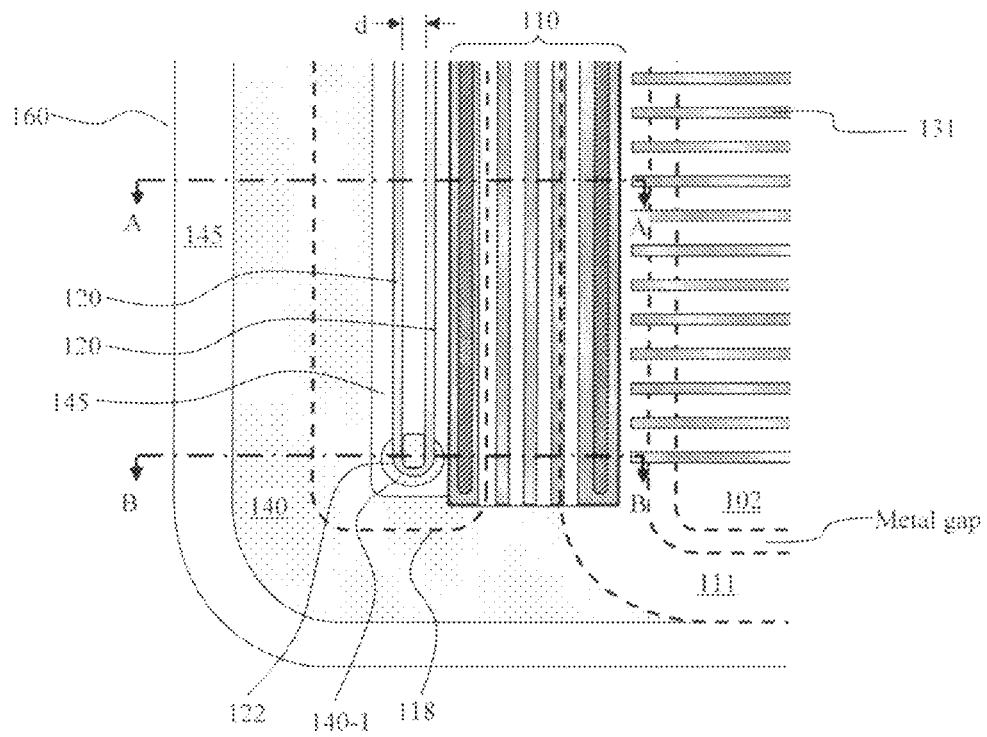
Fig. 3B-2
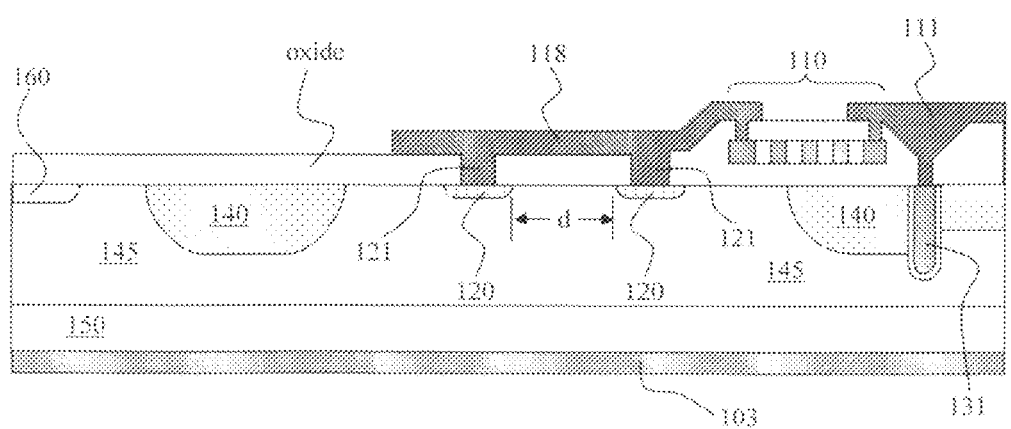
Fig. 3C Cross Section A-A

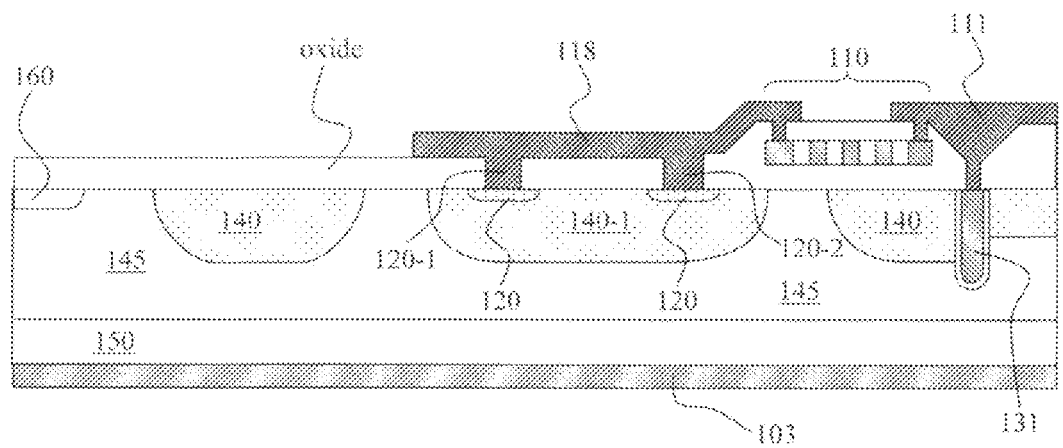
Fig. 3D Cross Section B-B
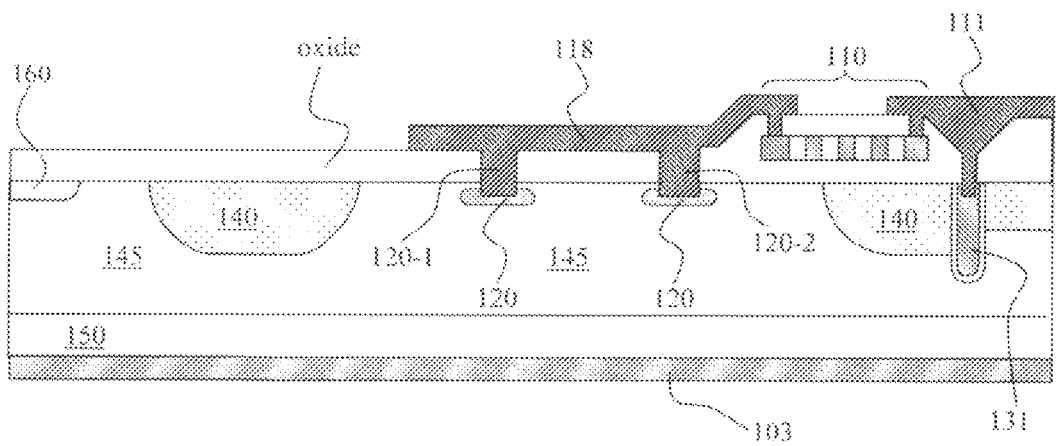
Fig. 4 Cross Section A-A

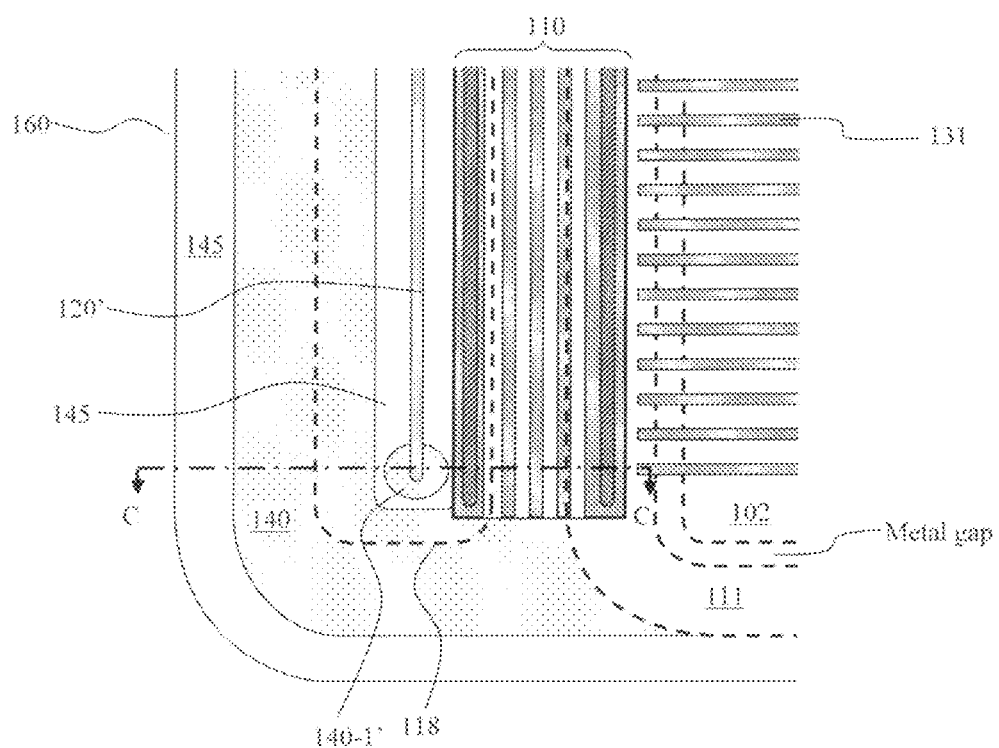
Fig. 4A
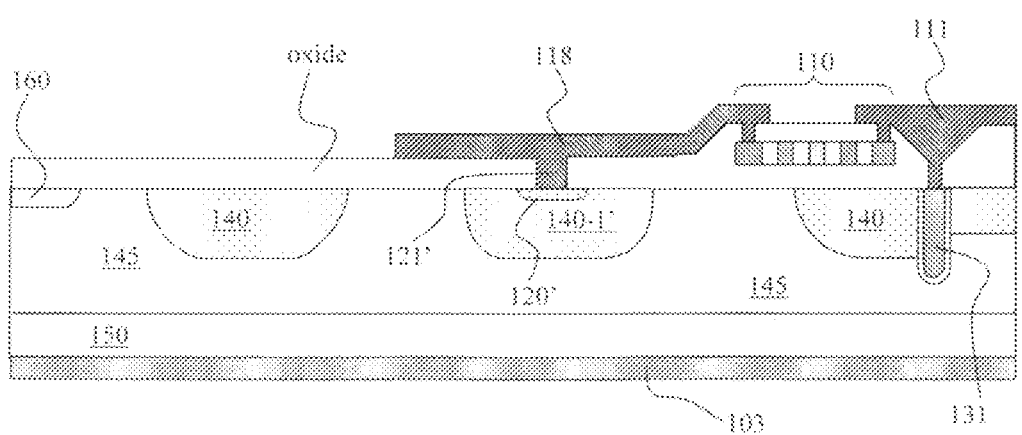
Fig. 4B Cross Section C-C

CONFIGURATION OF GATE TO DRAIN (GD) CLAMP AND ESD PROTECTION CIRCUIT FOR POWER DEVICE BREAKDOWN PROTECTION

This patent application is a Divisional Application and claims the Priority Date of a application Ser. No. 12/378,039 filed on Feb. 9, 2009 now U.S. Pat. No. 7,902,604 by common Inventors of this application. The Disclosures made in the patent application Ser. No. 12/378,039 are hereby incorporated by reference.

BACKGROUND OF THE INVENTION

1. Field of the Invention

The invention relates generally to the layout and manufacturing process of the semiconductor power devices. More particularly, this invention relates to an improved configuration of gate-to-drain (GD) clamp combined with the electrostatic discharge (ESD) protection circuit for power device breakdown protection to achieve smaller die size, reduced leakage currents, better control of the GD clamp breakdown voltage and lower production cost.

2. Description of the Prior Art

Conventional layout for manufacturing semiconductor power devices with protection circuits against breakdown and also against electrostatic discharges (ESD) still has a limitation. A general practice is to place the multiple gate-to-drain Zener diodes at the periphery of the die. These gate-to-drain Zener diodes may be made in the same way as gate-to-source ESD diodes. The configuration causes the die size to increase and therefore increases the production costs of the power devices. Another technical difficulty is related to the great width of the gate to drain Zener diode. The leakage current Idss is proportional to the width of the Zener diodes in this configuration. The great width of the Zener diodes thus makes it difficult to limit the Idss leakage current under 10 µA that is generally required in many of such power device applications.

FIG. 1 is a top view of the gate-drain clamp for the device as generally implemented in the conventional semiconductor power device. The gate to drain clamping voltage is implemented with a plurality of Zener diodes 110 on the periphery of the device. The multiple Zener diodes as shown thus occupy large areas of the die. Furthermore, as discussed above, the Zener diodes formed around all the peripheral edges have a very large width thus causing the drain-source leakage Idss current to increase significantly and adversely affect the performance rating of the clamping circuits.

The function of a gate-to-drain (GD) clamp is to work with a gate resistor to turn on the FET before the drain to source voltage reaches avalanche breakdown that can potentially cause permanent damage to FET. The GD clamp function as disclosed by U.S. Pat. No. 5,365,099 is implemented with back-to-back polysilicon diodes alone. The back-to-back polysilicon diodes are usually made as alternating P and N stripes. However, such device has a drawback that the polysilicon diodes occupy too much space wherein each stripe has a width of approximately five microns for protecting a breakdown voltage up to six volts.

Shen et al. disclose in U.S. Pat. No. 5,536,958 a semiconductor device that has an improved high voltage protection by including an integrated Schottky diode in conjunction with a plurality of back-to-back polysilicon diodes to limit the voltage potential that may arise between the gate and the drain terminal. In another embodiment of U.S. Pat. No. 5,536,958, a contact region is formed in the substrate rather than a Schottky diode to contact the back-to-back diodes to support some of the voltage with a pinch-off effect with the remainder of the voltage supported by the substrate. The structure is able to support excessive voltage in the conduction mode rather than the avalanche mode. Furthermore, in the 5$^{th}$ International Symposium of Power Semiconductor Device and IC in May, 1993. Yamazaki et al. disclose an over voltage protection circuit by integrating a silicon avalanche diode with an insulated-gate bipolar transistor (IGBT) structure that further includes a polysilicon Zener diode. With polysilicon diodes combined with Schottky diode or silicon diodes in these disclosures however the devices are limited to high breakdown voltage applications. Furthermore, the breakdown voltage for these types of clamping devices is difficult to control. Therefore, the GD clamping functions for device with low, well-controlled breakdown voltage applications with silicon diodes to supplement the back-to-back polysilicon diodes with space efficient configurations are still not available. Another problem with the prior art methods of GD clamping is that the breakdown voltage at the ends of the silicon diodes have lower breakdown voltage (BV) than the rest of the silicon diode regions. This will adversely affect the performance of the GD clamping by allowing current flow before the desired BV. The lowered BV is due to the higher electric fields that are present at the ends of P-N junctions.

A GD clamp comprising of polysilicon diodes alone occupies too much space. A conventional GD clamp comprising polysilicon diodes supplemented with a silicon or Schottky diode as disclosed in the prior art has difficulties in controlling the breakdown voltage. Therefore, it is necessary to provide an improved layout for the ESD and the gate-drain clamping circuits on the semiconductor power device such that the above discussed difficulties and limitations can be overcome.

SUMMARY OF THE PRESENT INVENTION

It is therefore an aspect of the present invention to provide a new and improved layout of an ESD protection circuit combined with gate-drain clamping on a semiconductor power device by forming a combination of gate to drain Zener diodes, a silicon diode and a small gate resistor for power MOSFETs' breakdown protection. The gate to drain Zener diode is only located at the one side of the die. Therefore, die size is reduced as compared to conventional design. Since the width of the gate to drain Zener diode is reduced, Idss leakage is low. No additional masks are needed as compared to a conventional power MOSFETs with polysilicon ESD diodes process. Gate to source Zener diodes may be added for ESD protection without any additional cost. It is another aspect of this invention that it provides a method to achieve a low Idss leakage, low resistance in gate to drain clamp with a smaller die size, therefore, low cost. It is another aspect of this invention to achieve a well-controlled breakdown voltage for the GD clamp, which is scalable to low voltage applications.

Briefly in a preferred embodiment this invention discloses a semiconductor power device supported on a semiconductor substrate comprising a plurality of transistor cells each having a source and a drain with a gate to control an electric current transmitted between the source and the drain. The semiconductor further includes a GD clamp circuit connected in series between the gate and the drain further includes a plurality of back-to-back polysilicon diodes connected in series to a silicon diode which includes parallel doped columns in the semiconductor substrate wherein the parallel doped columns having a predefined gap. In an exemplary embodiment, the doped columns having a gap ranging between 2 to 5-micrometers between the doped columns for achieving a breakdown voltage ranging from 63 to 75 volts. In another exemplary embodiment, the doped columns further include a U-shaped (as seen from above) bend connecting the ends of the parallel doped columns together. In an alternate embodiment a doped well of the same conductivity type as the parallel doped columns is disposed below and about the ends of the columns and engulfs the U-shaped bend in an end well, which quells the tendency for the ends of the doped columns to have a lower breakdown voltage than the rest of the columns. In another embodiment the back-to-back polysilicon diodes are connected on one end in series to the silicon diode by a floating metal, and on the other end to a gate metal; this gate metal connects to the gate electrode (gate pad) through a gate resistor Rg, and directly contacts gate runner trenches. In another exemplary embodiment, the GD clamp termination disposed on only one side near an edge of the semiconductor substrate supporting the semiconductor power device. In another exemplary embodiment, the GD clamp termination is disposed on only one side near an edge of the semiconductor substrate for disposing a gate pad connected to the gate via a plurality gate runners extended thereto. In another exemplary embodiment, the semiconductor substrate further includes a deep doped well disposed below the silicon diode. In another exemplary embodiment, the semiconductor substrate further includes contact openings opened above the doped columns of the silicon diode and filled with a contact metal for connecting to the silicon diodes formed as doped columns in the semiconductor substrate. In another exemplary embodiment, wherein the contact metal for connecting to the silicon diodes is a floating metal connected between the back-to-back polysilicon diodes and the doped columns of the silicon diode. In another exemplary embodiment, the semiconductor substrate further includes a floating well (optionally deep wells) disposed next to a channel stop near an edge of the semiconductor substrate. In another exemplary embodiment, the back-to-back diodes includes a plurality of alternating doped regions in a polysilicon layer disposed on top of an insulation layer above the semiconductor substrate. In another exemplary embodiment, the semiconductor power device further includes a gate-to-source (GS) ESD protection circuit comprising gate-to-source (GS) back-to-back Zener diodes. In another exemplary embodiment, the GD clamping termination and GS ESD protection circuit are processed with no additional manufacturing masks. The GD clamping Zener diodes are formed using the same masks as the GS ESD structure.

This invention further discloses a method for clamping a gate-to-drain voltage of a semiconductor power device supported on a semiconductor substrate comprising a plurality of transistor cells each having a source encompassed in a body region and a drain with a gate to control an electric current transmitted between the source and the drain. The method further comprises a step of interconnecting a gate-to-drain (GD) clamp circuit between the gate and the drain by forming a plurality of back-to-back diodes connected in series to a silicon diode comprising doped regions in the semiconductor substrate and connecting the back-to-back diodes to the gate. In an exemplary embodiment, the method further includes a step of forming the doped regions as doped columns in the semiconductor substrate to function as the silicon diode connecting to the back-to-back diodes. In another exemplary embodiment, the method further includes a step of forming the doped regions as doped columns connected on one end of the columns by an U-shaped bend doped-region to function as the silicon diode connecting to the back-to-back diodes These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 3B-1 and 3B-2 are explosive views of the lower-left corner of the device in FIG. 3A, and FIGS. 3C and 3D are cross sectional views taken along cross sections A-A and B-B, respectively, of FIG. 3B-2.

FIG. 4 is a cross sectional view of an alternative embodiment of the invention, taken along cross section A-A of FIG. 3B-2.

FIG. 4A is a top view of an alternative embodiment of the invention.

FIG. 4B is a cross sectional view of an alternative embodiment of the invention taken along cross section C-C of FIG. 4A.

DETAILED DESCRIPTION OF THE METHOD

Figure 2:
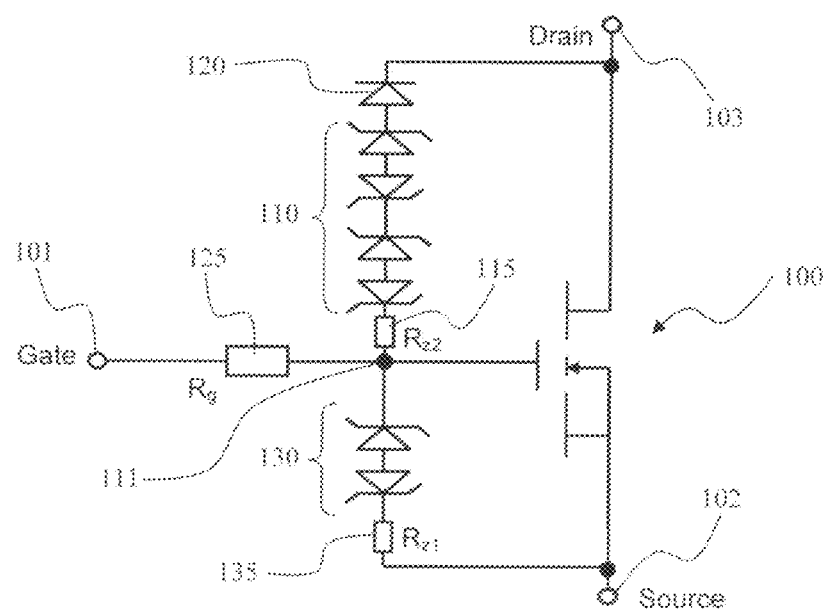
FIG. 2 is a circuit diagram of an improved GD clamp circuit of this invention.

FIG. 2 is a circuit diagram to illustrate the breakdown protection circuit of a MOSFET device 100 of this invention. The MOSFET device has a gate electrode 101, a source electrode 102 and drain electrode 103. The GD clamp circuit applies a combination of gate to drain Zener diode pairs, shown as polysilicon diodes 110 with a parasitic resistance Rz2 115, a silicon diode 120 and a small gate resistor Rg 125 to serve the function of breakdown protection for the power MOSFET. The Zener diode pairs 110 comprise back-to-back Zener diodes. In addition to the GD clamp circuit, the breakdown protection circuit may further comprise a gate-to-source ESD protection circuit including gate-to-source Zener diode pairs 130 with parasitic resistance Rz1 115. FIGS. 3A-D below further illustrate that the gate to drain Zener diode pairs 110 that are formed at only one side of the die. Therefore, die size is reduced as compared to conventional design. The GD clamp circuit is electrically connected to the drain electrode 103 disposed on the bottom surface of the substrate wherein the electrically connections are well know and not specifically shown herein the drawings. Since the width of the gate to drain Zener diodes 110 is reduced, Idss leakage is low. The gate to source Zener diode pairs 130 may be added for ESD protection without any additional cost. No additional masking steps are required in the manufacturing processes of forming the GD clamp compared to conventional manufacturing process for providing ESD protection for the power MOSFETs.

Figure 1:
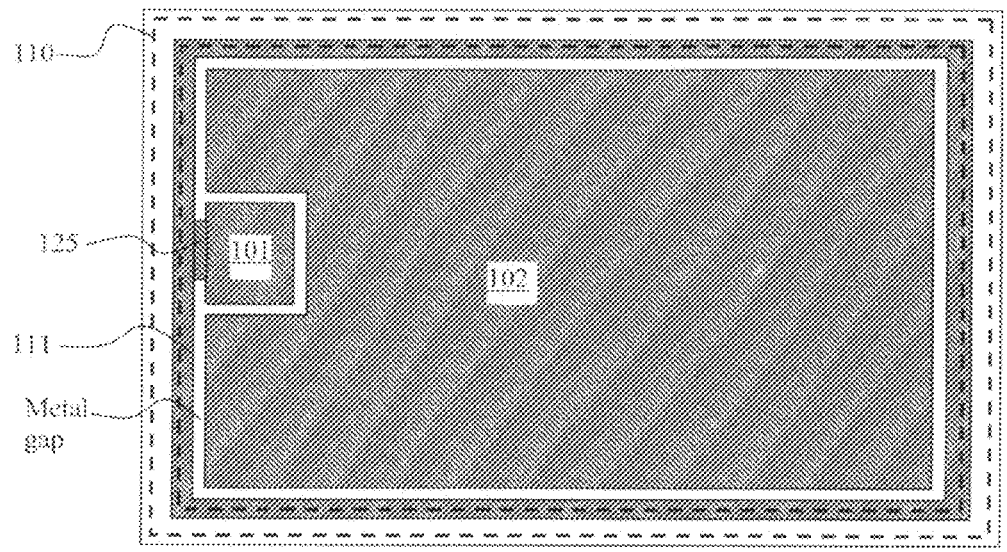
FIG. 1 is a top schematic view of a corner of a conventional device to show the structural features of a conventional GD clamp.
Figure 3A:
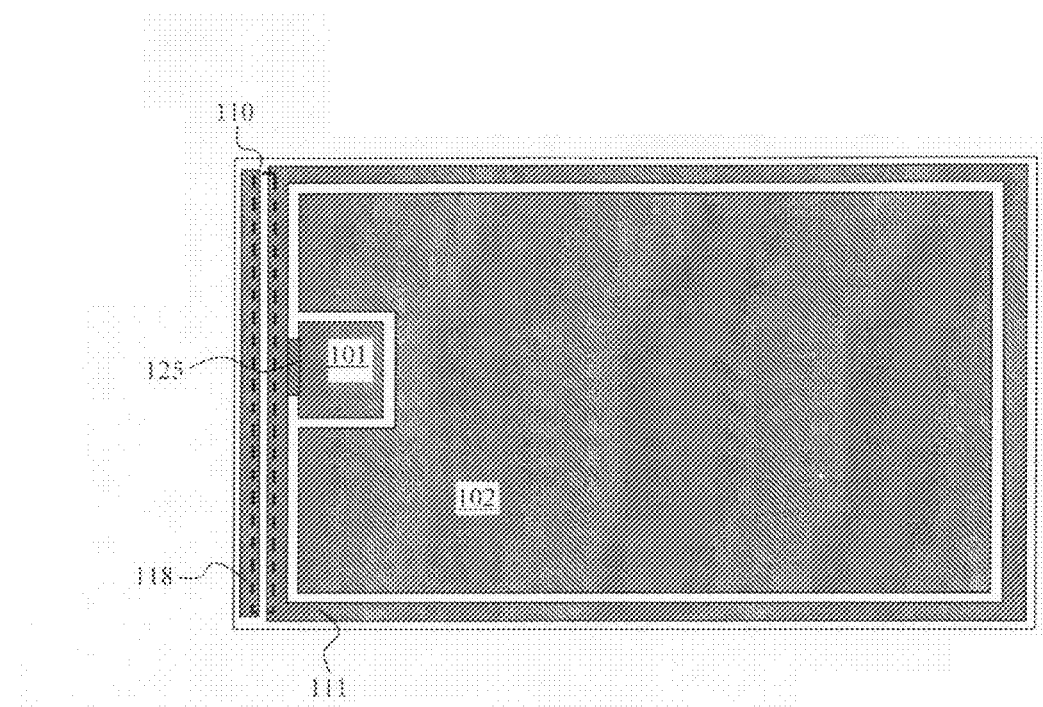
FIG. 3A is a top view of a MOSFET device with an improved GD clamp.
Figures 1, 3B:
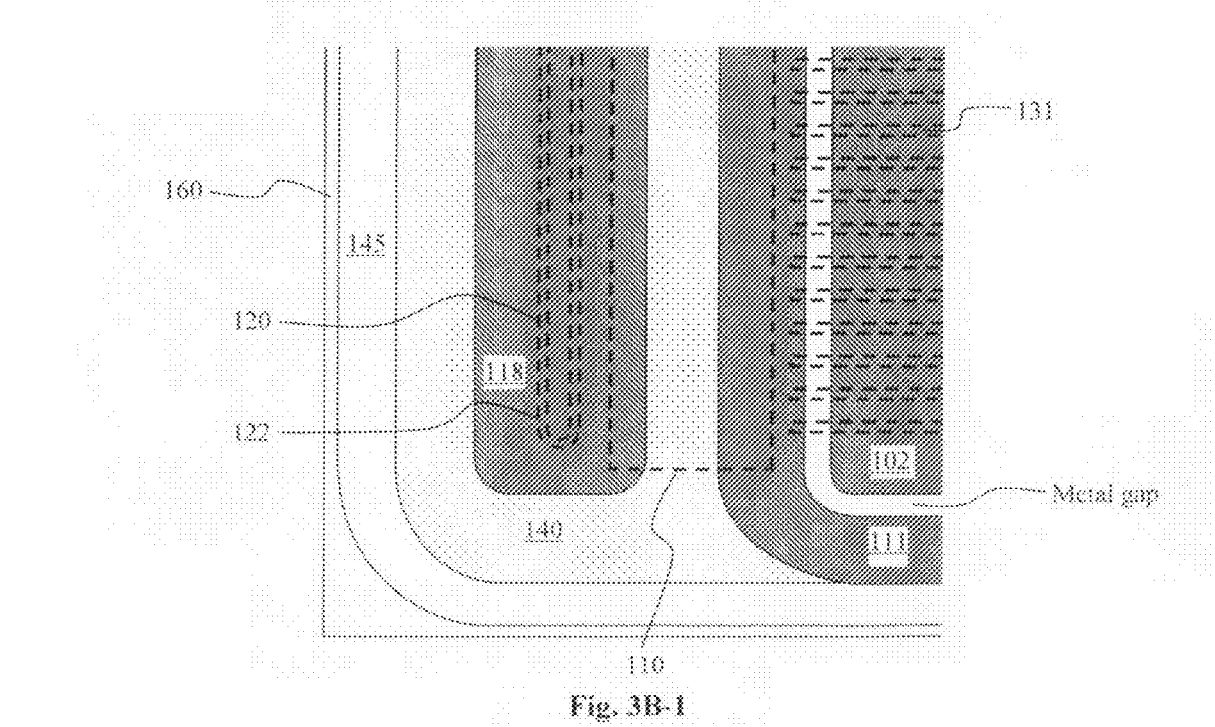

FIG. 3A is a top view of a semiconductor die with improved GD clamp circuit of this invention. FIGS. 3B-1 and 3B-2 are explosive views of the bottom-left corner of FIG. 3A, and FIGS. 3C and 3D are cross sectional views of cross sections A-A and B-B, respectively, of FIG. 3B-2. Oxide and passivation layers are not shown in FIGS. 3A, 3B-1 and 3B-2 to avoid obscuring the details. FIG. 3B-2 is a top view of the same area as FIG. 3B-1, except that the metal layers are made transparent in FIG. 3B-2 to better illustrate the polysilicon diodes 110 and the silicon diode 120. The outlines of the polysilicon diodes 110 and the silicon diode 120 are shown in FIG. 3B-1. The GD clamp circuit is formed on only one side of the die to reduce the area it occupies on the die. This allows more of the die area to be used as active area. The gate electrode 101, e.g. the gate pad, is connected to gate metal 111 through the gate resistor Rg 125. The gate metal 111 encircles the source metal 102, and is directly connected to gate runner trenches 131. The gate metal 111 and the source metal 102 are separated by a metal gap. The gate metal 111 is connected to one side of the gate-drain polysilicon diodes 110. The polysilicon diodes 110 are connected on the other side to the silicon diode 120 through a floating metal 118. The floating metal 118 connects the silicon diode 120 in series with the polysilicon diodes 110. As shown in FIG. 3C, the silicon diode is a PN junction with the silicon diode implant having the same conductivity type as the body regions, P-type for n-channel FET. In this case, the N side of the diode is the epitaxial layer 145, which sits on the substrate 150 functioning as the drain for the MOSFET device. As an aside, the epitaxial layer 145 and the substrate 150 are sometimes referred to together as the semiconductor substrate. A channel stop region 160 may be formed at the edge of the semiconductor die.

The silicon diodes 120 are formed as implant regions in the substrate through contact openings 121 in an oxide layer. Floating wells 140 provide isolation. The floating wells 140 may form a ring surrounding the silicon diode 120. The implant region to form the silicon diode 120 and the floating wells 140 are of the same conductivity type as the body region of the MOSFET. The channel stop 160, floating wells 140, silicon diode 120, and gate runner trenches 131 are all formed in the epitaxial layer 145 of the die. The epitaxial layer 145 is formed over the substrate 150. The drawings presented here are not to scale. The epitaxial layer 145 and the substrate 150 are of the same conductivity type as the source and serve as the drain of the MOSFET. A drain electrode 103 is connected to the bottom of the substrate 150. The silicon diode 120 comprises two parallel doped columns, separated by a pre-set gap, d. In a preferred embodiment, the parallel doped columns further comprise a U-shaped bend 122 (FIGS. 3B-1 and 3B-2) to connect the ends of the columns together. Sharp angles and corners bring about higher electric fields, which lower the breakdown voltage. Thus the ends of regions tend to have lower breakdown voltages than the rest of the region which can cause undesired effects such as current leakage and premature turn-on. The U-shaped bend 122 helps to alleviate this effect and allows for a more controlled and uniform breakdown voltage. In an exemplary embodiment as shown, the ends of the parallel doped columns of the silicon diode 120 are further encompassed by an end well 140-1, as shown in FIG. 3D. The end well 140-1 has the same conductivity type as the parallel stripes of the silicon diode 120, but a lower doping concentration, and so further improves control of the breakdown voltage by raising the BV at the ends of the silicon diode 120 to above the desired BV. This way the ends of the silicon diodes will not cause the above discussed problems of leakage and pre-mature turn-on. The U-shaped bend 122 and the end well 140-1 provide better control to the overall breakdown voltage. The spacing of the silicon diodes allows one to adjust the breakdown voltage (BV). A bigger gap reduces the BV and vice-versa because of the changes of the electrical field. For example, a gap of 2 micrometers has an overall BV of 75 V and a gap of 5 micrometers will have an overall (Zener+silicon) BV of 63.7 V. For the BV of the silicon diode alone, a 2 micrometers gap may have a BV of 44.5 V, and a 4 micrometers gap may have a BV of 35.6 V FIG. 4 shows a cross section of an alternative embodiment of this invention. Like FIG. 3D it is taken along cross section A-A of FIG. 3B-2. In this embodiment, a shallow silicon etch is performed through the contact openings 120-1 and 120-2 prior to implanting the silicon diode 120. This etching process creates a configuration that includes extra corners and edges into the parallel doped columns which increases the electric field and lowers the breakdown voltage of the silicon diode 120. The contact region (anode type region of silicon diode) depth is very shallow, about 0.1-0.2 micrometers after implant and diffusion. As described above, a shallow contact region of the diode has lower BV.

FIG. 4A shows a top view of an alternative embodiment of this invention, and FIG. 4B shows a cross sectional view taken along cross section C-C of FIG. 4A. They are similar to FIGS. 3B-2 and 3D, but its silicon diode 120' only comprises a single column rather than two parallel columns. The column is implanted through contact opening 121' in the oxide. The end of the column for silicon diode 120' is enclosed in an end well 140-1 that serves to improve control of the breakdown voltage of the silicon diode 120'. To those skilled in the art, it is apparent that the concept of enclosing the ends of a diode in a deep well can improve control of the breakdown voltage regardless of the design of the diode. For example, the diode may comprise one, two, or more columns. Alternatively, the ends of the columns may not be connected in a U-shaped bend, but are still enclosed within the end well 140-1. The floating wells 140 and end well may be formed as deep well with a depth of about 2 micrometers. The floating wells and end well may not necessarily be deep well and can also be formed with the same depth as regular body region. By way of example, a device with a single deep well guard ring with a spacing of 4 micrometers from the silicon diode 120 may have a BV of 97V.

Figure 5:
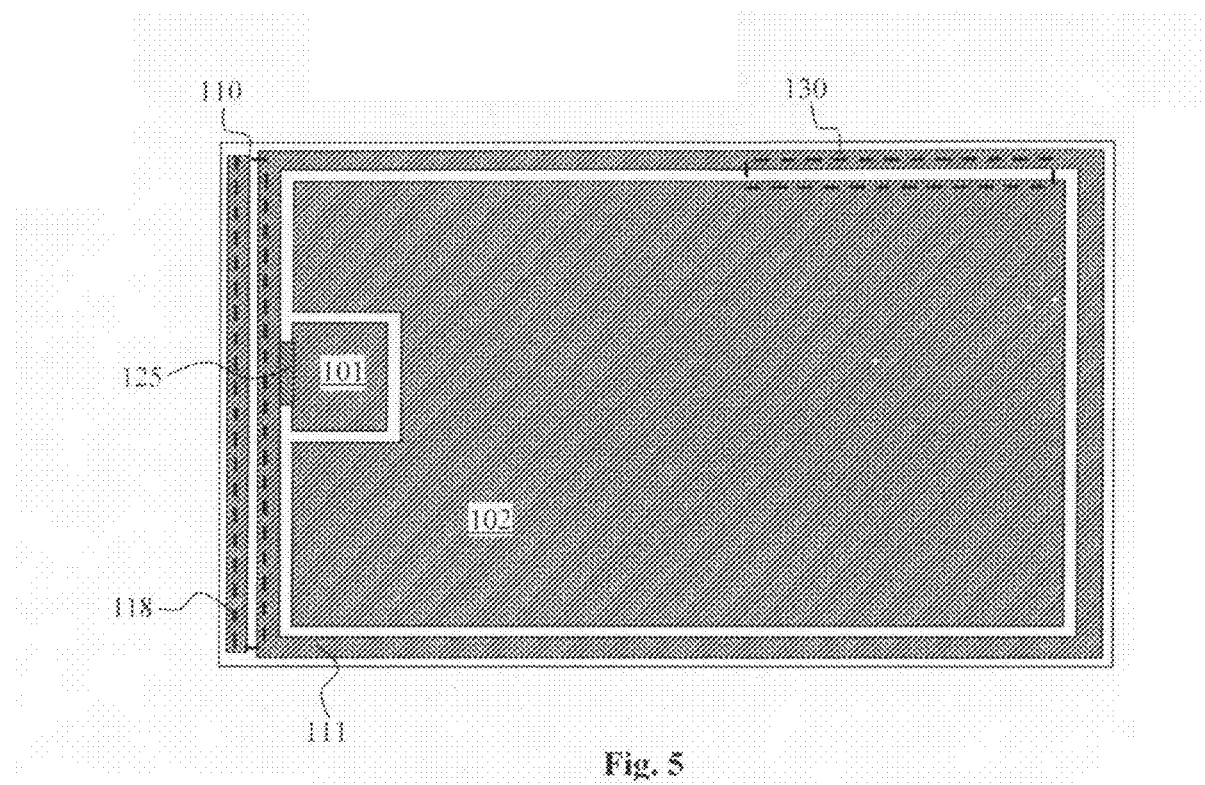
FIG. 5 is a top view of a MOSFET device with an improved GD clamp, along with a gate-to-source ESD protection circuit.
Figure 6:
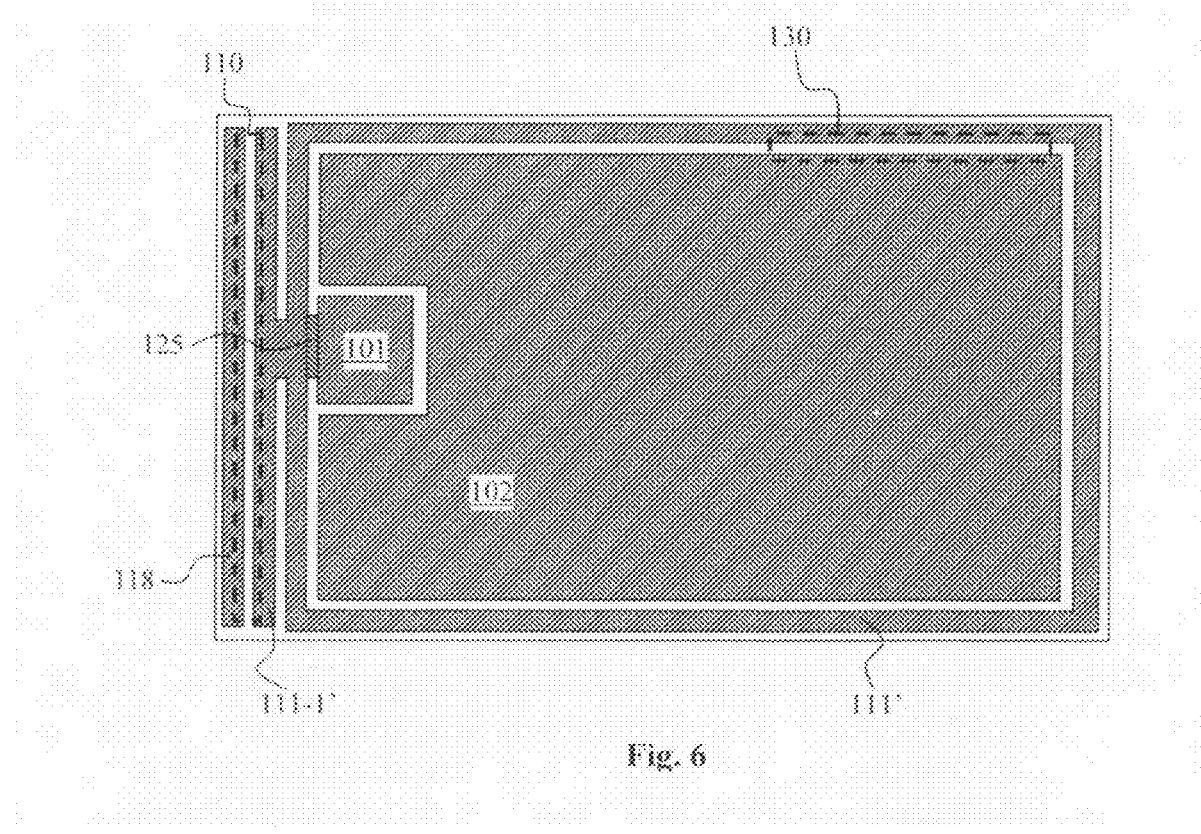
FIG. 6 is a top view of a MOSFET device with an improved GD clamp, along with a gate-to-source ESD protection circuit, with an alternate layout of the gate metal.

FIG. 5 shows a top schematic view of an alternative embodiment of the invention. The semiconductor die has a GD clamp circuit, and also a gate-to-source (GS) ESD protection circuit 130. The GS ESD protection circuit 130 is well known in the art. To one skilled in the art, it is apparent that the GS protection circuit 130 may be formed using the same manufacturing steps as the GD clamp, so there is no extra cost. FIG. 6 shows the top view of another alternative embodiment of this invention. It is similar to FIG. 5, but the gate metal 111', includes an extra section 111-1' that helps channel gate-to-drain current towards the gate resistor Rg 125.

Figure 7A:
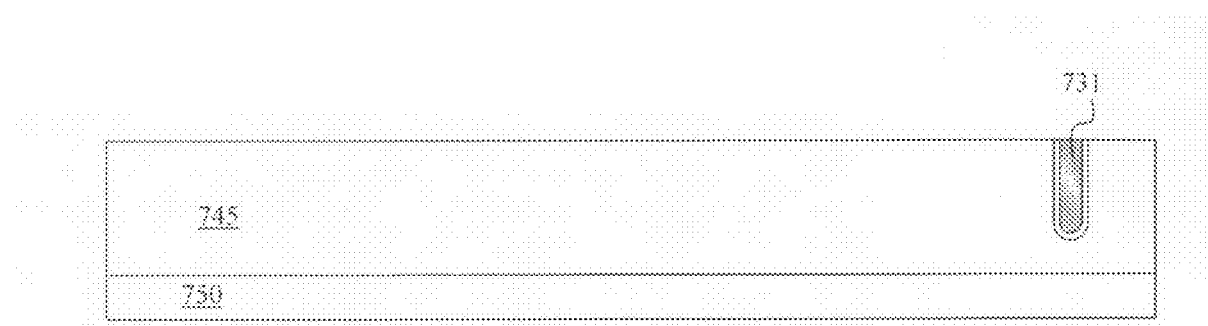
FIGS. 7A-7I are a series of cross sectional views showing a method of manufacturing a MOSFET device with an improved GD clamp.
Figure 7B:
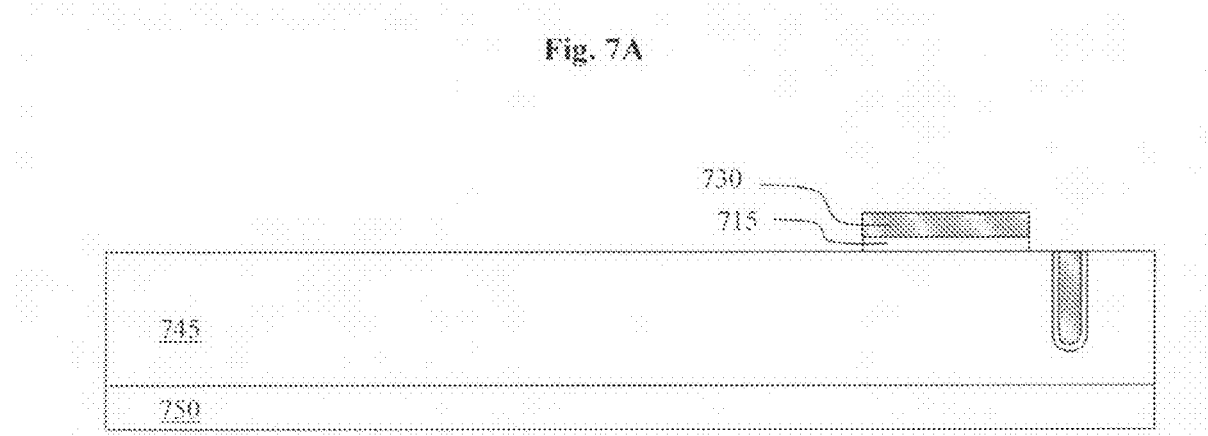
Figure 7C:
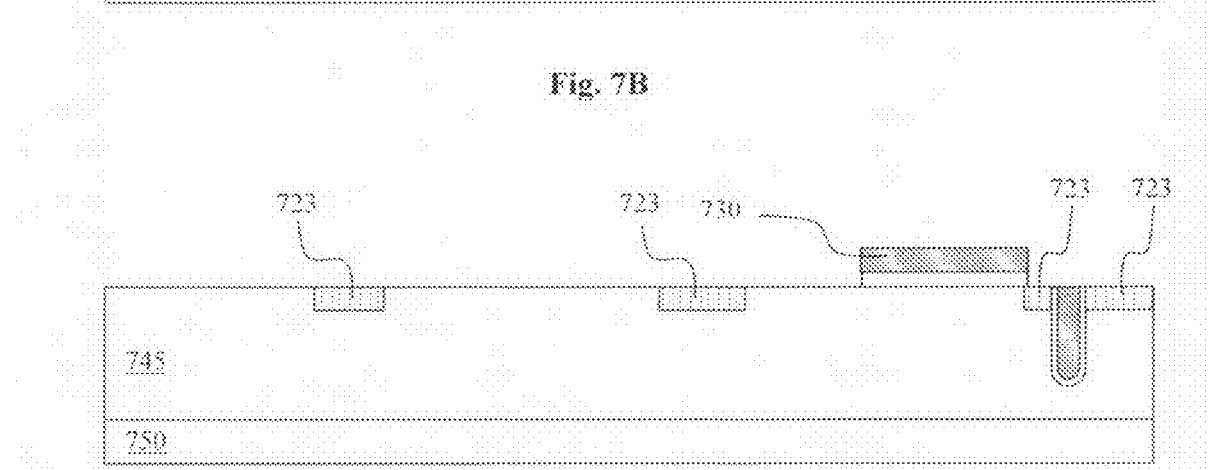
Figure 7D:
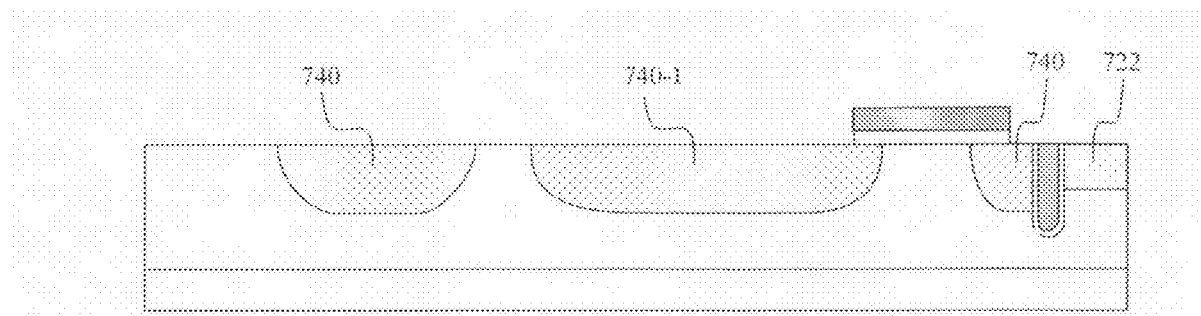

FIGS. 7A to 7I are a series of cross sectional views showing a method for forming the improved GD clamp. FIG. 7A starts with an epitaxial layer 745 over a substrate 750. Gate trenches (not shown) and gate runners 731 are formed in the epitaxial layer 745. Then a polysilicon layer 730 is grown over an oxide layer 715 and patterned as shown FIG. 7B. The polysilicon layer 730 is doped the same conductivity type as the body region of the MOSFET. A body mask is applied and a body implant 723 is carried out to form the body regions 722 and floating well regions 740 and end well 740-1 as shown in FIG. 7C-D. In FIG. 7D the implants are diffused out to form the floating well regions 740, end well 740-1 and body regions 722. If the floating wells 740, and end well 740-1 are deep wells, then an extra mask and diffusion may be needed to form them. Optionally the body regions 722, floating well regions 740 and end well 740-1 may be formed before the polysilicon layer 730 and oxide layer 715 are formed.

Figure 7E:
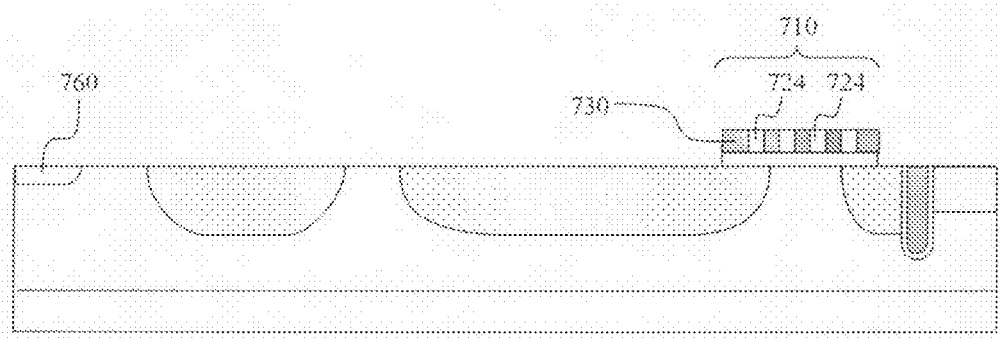
Figure 7F:
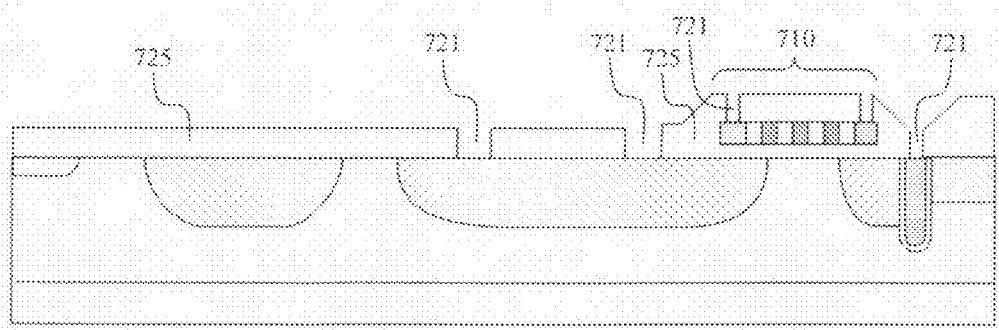
Figure 7G:
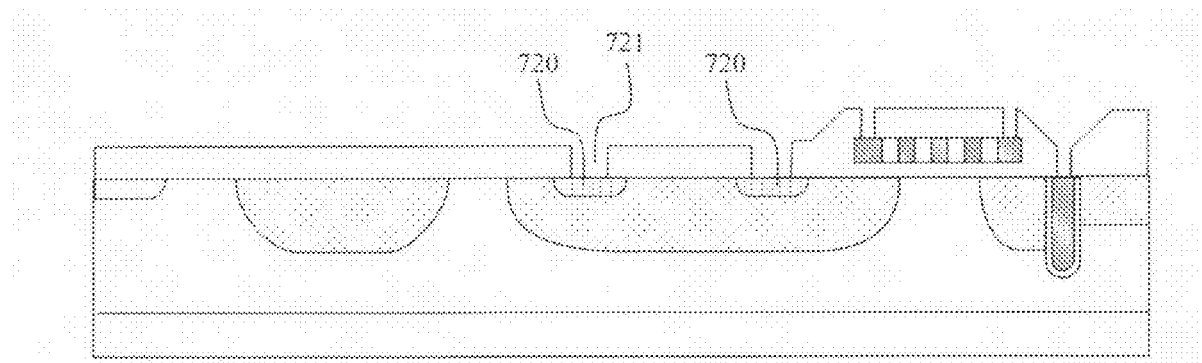
Figure 7H:
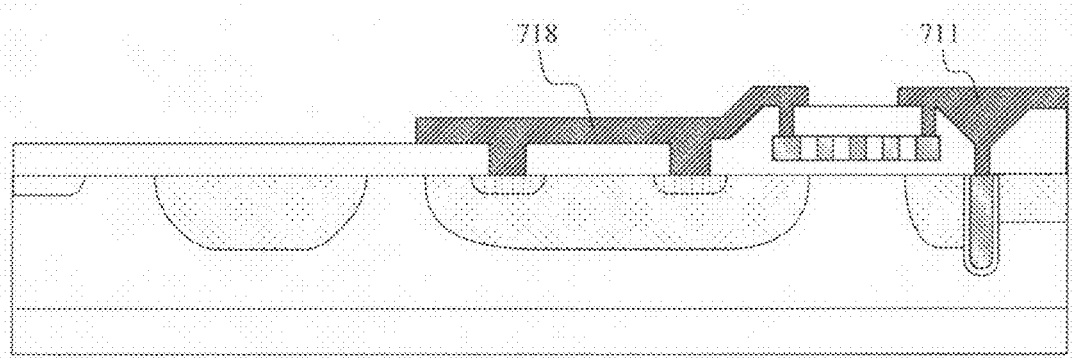
Figure 7I:
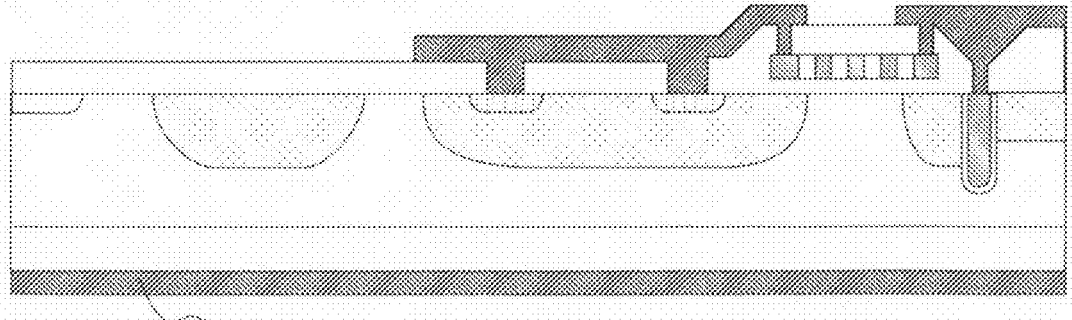

In FIG. 7E a source mask is used to implant and form source regions (not shown), stripes 724 in the polysilicon layer 730, and channel stop 760. The polysilicon layer 730 now has alternating P and N type stripes, thus forming the back to back Zener diodes 710 of the GD clamp. An insulating layer 725, such as an oxide, is deposited and patterned to form contact openings 732 as shown in FIG. 7F. In FIG. 7G a body contact implant is carried out through contact openings 721 to form body contacts (not shown) and the silicon diode 720, followed by metal deposition and patterning in FIG. 7H to form the top metal layers: source metal (not shown), gate metal 721, and floating metal 718. In FIG. 7I the backside metal is deposited, forming the drain metal 703. It should be apparent of one skilled in the art that forming the improved GD clamp requires no extra manufacturing steps compared with forming a standard GS ESD protection circuit having back-to-back polysilicon diodes. Therefore the GD clamp may be formed on a MOSFET device having a GS ESD protection circuit for no extra manufacturing cost.

Although the present invention has been described in terms of the presently preferred embodiment, it is to be understood that such disclosure is not to be interpreted as limiting. Various alterations and modifications will no doubt become apparent to those skilled in the art after reading the above disclosure. For example, other conductive material instead of polysilicon may be used. The technique can apply to both N- and P-channel MOSFETs and LDD MOSFETs. Accordingly, it is intended that the appended claims be interpreted as covering all alterations and modifications as fall within the true spirit and scope of the invention.

We claim:

1. A method for clamping a gate-to-drain voltage of a semiconductor power device supported on a semiconductor substrate comprising a plurality of transistor cells each having a source encompassed a drain with a gate to control an electric current transmitted between the source and the drain, wherein the method further comprising:
   interconnecting a gate-to-drain (GD) clamp circuit between said gate and said drain by forming a plurality of back-to-back polysilicon diodes connected on a first side in series to a silicon diode comprising at least one doped column in said semiconductor substrate and connecting said back-to-back polysilicon diodes on a second side to a gate electrode through a gate resistor; and
   forming parallel doped columns in said semiconductor substrate to function as said silicon diode, wherein the parallel doped columns having a predefined gap for controlling breakdown voltage.

2. The method of claim 1 wherein:
   said step of forming said parallel doped columns further comprises connecting the ends of the doped columns together with a U-shaped bend.

3. A method for clamping a gate-to-drain voltage of a semiconductor power device supported on a semiconductor substrate comprising a plurality of transistor cells each having a source encompassed in a body region and a drain with a gate to control an electric current transmitted between the source and the drain, wherein the method further comprising:
   interconnecting a gate-to-drain (GD) clamp circuit between said gate and said drain by forming a plurality of back-to-back polysilicon diodes connected on a first side in series to a silicon diode comprising at least one doped column in said semiconductor substrate and connecting said back-to-back polysilicon diodes on a second side to a gate electrode through a gate resistor; and
   forming an end well under the ends of said at least one doped column, wherein the end well has the same conductivity type as the doped column and has a lower doping concentration than the doped column.

\* \* \* \* \*